United States Patent [19]
Onodera et al.

[11] Patent Number: 5,371,465
[45] Date of Patent: Dec. 6, 1994

[54] INSPECTION METHOD AND APPARATUS USING NUCLEAR MAGNETIC RESONANCE (NMR)

[75] Inventors: Yukari Onodera, Hachioji; Etsuji Yamamoto, Akishima; Ryuichi Suzuki, Kokubunji, all of Japan

[73] Assignee: Hitachi, Ltd., Tokyo, Japan

[21] Appl. No.: 850,589

[22] Filed: Mar. 13, 1992

[30] Foreign Application Priority Data

Mar. 13, 1991 [JP] Japan ................................. 3-047865
Jul. 4, 1991 [JP] Japan ................................. 3-164265

[51] Int. Cl.$^5$ .............................................. G01R 33/20
[52] U.S. Cl. ...................................... 324/309; 324/307
[58] Field of Search ............... 324/307, 309, 320, 318, 324/322, 314, 312, 313

[56] References Cited

U.S. PATENT DOCUMENTS

| | | | |
|---|---|---|---|
| 4,656,447 | 4/1987 | Keim | 324/320 |
| 4,661,775 | 4/1987 | Kormos | 324/312 |
| 4,700,136 | 10/1987 | Yamaguchi et al. | 324/320 |
| 4,720,679 | 1/1988 | Patrick et al. | 324/320 |
| 4,797,615 | 1/1989 | Rotem | 324/309 |
| 4,906,934 | 3/1990 | Haragashira | 324/322 |
| 4,950,994 | 8/1990 | Glover et al. | 324/318 |
| 4,987,371 | 1/1991 | Glover | 324/320 |
| 5,162,737 | 11/1992 | Nozokido et al. | 324/309 |

OTHER PUBLICATIONS

Miller et al, "Carbon 13 Refocused Gradient Imaging of Solids", J. of Mag Res. 85, 255-264 (1989).
Fujiwara et al, "Composite Inversion Pulses with Frequency Switching and Their Application to Broad Band Decoupling" J of Magn Res 77, 53-63 (1988).

*Primary Examiner*—Walter E. Snow
*Assistant Examiner*—Raymond Y. Mah
*Attorney, Agent, or Firm*—Antonelli, Terry, Stout & Kraus

[57] ABSTRACT

In an inspection apparatus using nuclear magnetic resonance (NMR), a spatial distribution of homogeneity of a static magnetic field can be quickly measured even when a heterogeneous object is inspected, by measuring simultaneously phase data and a transverse relaxation time at the same spatial position of the heterogeneous object, removing the difference of a phase term due to a chemical shift by anticipating components at that position and obtaining only the phase data resulting from static magnetic field inhomogeneity. A plurality of low-pass filters are provided to a shim power supply unit for driving a shim coil for generating additional static magnetic fields to correct static magnetic field homogeneity so that a low-pass filter having a small time constant is used at the time of adjustment of static magnetic field homogeneity so as quickly adjust static magnetic field homogeneity, and a low-pass filter having a large time constant is used at the time of the actual measurement of the object in order to prevent degradation of S/N of signals.

14 Claims, 5 Drawing Sheets

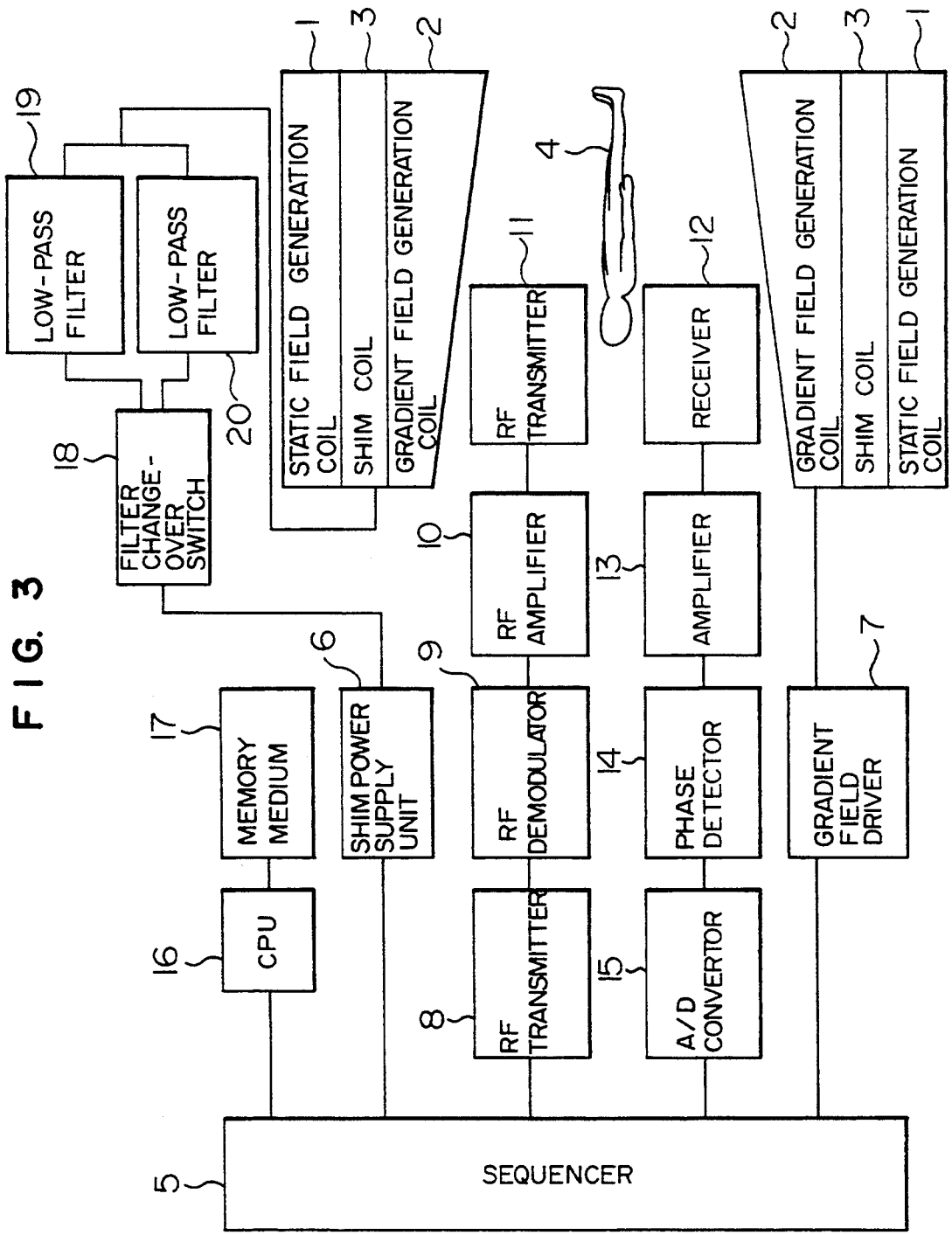
F I G. 3

INSPECTION METHOD AND APPARATUS USING NUCLEAR MAGNETIC RESONANCE (NMR)

BACKGROUND OF THE INVENTION

This invention relates to an inspection method using nuclear magnetic resonance (NMR). More in particular, it relates to an inspection method using NMR which can quickly measure a spatial distribution of static magnetic field homogeneity and can adjust quickly static magnetic field homogeneity when a heterogeneous object is placed inside an inspection apparatus using nuclear magnetic resonance (MRI: magnetic resonance imaging).

In the MRI, adjustment of static magnetic field homogeneity (shimming) is indispensable in order to obtain excellent images and spectra having high resolution. In such MRI's, determination of the distribution of inhomogeneity of the static magnetic field is indispensable, too, in order to adjust static magnetic field homogeneity on the basis of the distribution of inhomogeneity. As discussed in Journal of Magnetic Resonance, 77, pp. 40-52(1988), for example, a method which determines static magnetic field homogeneity from phase data of echo signals obtained by the inversion of gradient magnetic fields for a homogeneous sample (object) such as water has gained a wide application in the past as the method of effecting such a measurement. FIG. 2 of the accompanying drawings shows an example of the method of measuring such phase data. Next, this method will be explained with reference to FIG. 2.

First of all, a spin of the sample (object) is excited by a 90° pulse and gradient magnetic fields Gx, Gy are then applied to change the phase of the spin. Subsequently, after a 180° pulse is irradiated, a spin echo is generated by the inversion of a gradient magnetic field Gz. In this instance, the inversion timing of the gradient magnetic field Gz is adjusted so that the interval between the point of time at which the echo signal becomes maximal and the 180° pulse is different by a very small time $\epsilon$ from the interval $\tau$ between the 90° pulse and the 180° pulse. When the time $\tau$ passes away from the irradiation of the 180° pulse, the phase shift of the spin resulting from static magnetic field inhomogeneity completely cancels out with the phase shift resulting from E(x, y, z) between 90° pulse and 180° pulse. For this reason, the image S(x, y, z) obtained by this measurement method contains only the phase data resulting from static magnetic field inhomogeneity during the very small time $\epsilon$. If a gyromagnetic ratio and the real and imaginary portions of the image S(x, y, z) are hereby represented by $\gamma$, Sr(x, y, z) and Si(x, y, z), respectively, static magnetic field inhomogeneity is given by the following equation:

$$E(x, y, z) = \frac{1}{\gamma\epsilon} \text{Arctan}\left(\frac{Si(x, y, z)}{Sr(x, y, z)}\right) \quad (1)$$

To adjust this static magnetic field homogeneity, it is customary to generate an additional magnetic field for correcting an inhomogeneous magnetic field by adjusting the values of currents flowing through multiple channels of a coil generally referred to as a "shim coil". To this end, it is necessary to delicately change the current value flowing through the multichannel coil for each channel so as to measure in advance shim characteristics from the change of the distribution of the static magnetic field, as described in Journal of Magnetic Resonance, 85, pp. 244-254 (198), for example.

SUMMARY OF THE INVENTION

Inhomogeneity of the static magnetic field is affected by the shape, etc, of the object. Therefore, the adjustment of the static magnetic field prior to the inspection is preferably carried out while the object is placed inside the MRI apparatus in the same way as the actual inspection of the object. In accordance with the prior art measurement method described above, however, it is not possible to discriminate between the phase change resulting from static magnetic field inhomogeneity and the phase change resulting from the chemical shift. Therefore, there remains the problem that the method cannot be applied when the object is heterogeneous such as the human body.

When static magnetic field homogeneity is adjusted by adjusting the current values flowing through the multichannel shim coil, it has been customary to use a low-pass filter having a large time constant in a shim power supply unit in order to reduce noise of detection signals at the time of inspection of the object. However, the larger the time constant of the low-pass filter of the shim power supply unit, the longer becomes the switching time of the shim current. For this reason, the prior art is not devoid of the problem, either, in that the adjustment of static magnetic field homogeneity cannot be made quickly.

It is a first object of the present invention to provide an inspection method using nuclear magnetic resonance (NMR) which can quickly measure a spatial distribution of static magnetic field homogeneity even when a heterogeneous object is placed inside an MRI apparatus.

It is a second object of the present invention to provide an inspection method using NMR which can quickly adjust static magnetic field homogeneity.

In an inspection method using nuclear magnetic resonance for inspecting an object, by generating a static magnetic field, gradient magnetic fields and radio frequency (RF) magnetic fields, generating an additional magnetic field for changing homogeneity of the static magnetic field by changing the values of currents flowing through coils (shim coils) having a plurality of channels, detecting nuclear magnetic resonance (NMR) signals from the object and processing the detection signals, the first object of the invention described above can be accomplished by an inspection method using NMR, which comprises a first step of measuring a phase distribution of a heterogeneous object and determining an inhomogeneity distribution of the static magnetic field from the phase distribution, and a second step of measuring a distribution of a transverse relaxation time of the object.

The second object described above can be accomplished by disposing two kinds of low-pass filters in a shim power supply unit with one of them having a small time constant and the other having a large time constant, using the low-pass filter having a small time constant when static magnetic field homogeneity is adjusted, and using the low-pass filter having a large time constant when the object is inspected.

In accordance with the inspection method using NMR according to the present invention, a transverse relaxation time is measured simultaneously with the phase distribution of the object, component distributions of the object are anticipated on the basis of the transverse relaxation time, and a phase term resulting from a chemical shift is removed in accordance with the component distributions. In this way, the distribution of the static magnetic field inhomogeneity can be obtained by the use of the phase distribution even from a heterogeneous object. The present invention provides a particular effect that the spatial distribution of static magnetic field homogeneity can be measured quickly even when an object containing a plurality of chemical seeds or in other words, a heterogeneous object, is placed inside the MRI apparatus.

When the adjustment of static magnetic field homogeneity is effected in the MRI prior to the actual measurement, the shim current values of multiple channels are changed. However, the low-pass filter having a smaller time constant among two kinds of low-pass filters is used in this case and the shim current can be quickly switched. Hence, the adjustment of the shim current can be made quickly. Since the mere measurement for adjusting static magnetic field homogeneity is hereby made, there occurs no problem even if noises contained in the signals become great to some extents. The actual measurement of the object is made after the adjustment of static magnetic field homogeneity. Since the shim current value is not switched at this time, the low-pass filter having a greater time constant is used in this case and the noises contained in the signals can be reduced. The present invention disposes two kinds of low-pass filters for the shim power supply unit, uses them in accordance with the object of use, and can adjust static magnetic field homogeneity without deteriorating an S/N of signals at the time of inspection of the object.

BRIEF DESCRIPTION OF THE DRAWINGS

FIG. 3 is a block diagram showing a structural example of an inspection apparatus for practicing the present invention;

DESCRIPTION OF THE PREFERRED EMBODIMENTS

Figure 1:
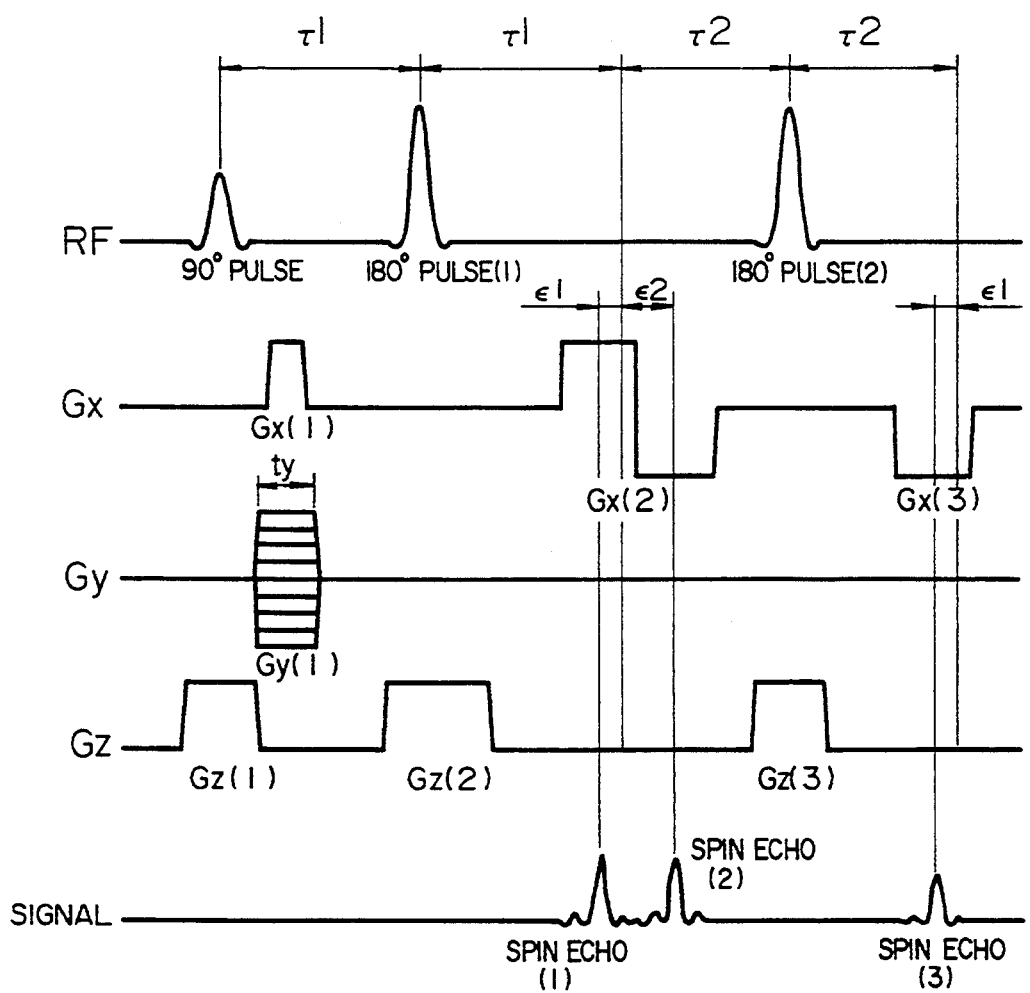
FIG. 1 is a sequence diagram showing a measurement method of a static magnetic field inhomogeneity distribution according to the present invention.
Figure 2:
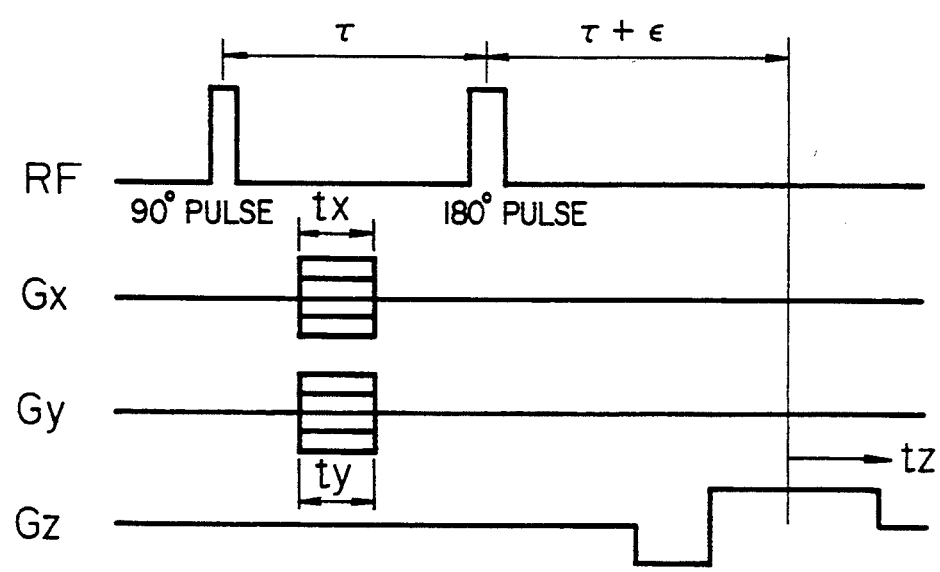
FIG. 2 is a sequence diagram showing a measurement method of a static magnetic field inhomogeneity distribution according to prior art.

Hereinafter, an embodiment of this invention for quickly carrying out the measurement of a static magnetic field inhomogeneity distribution using a heterogeneous object will be described in detail with reference to FIGS. 1 and 3.

FIG. 3 is a structural view showing an example of an inspection apparatus using nuclear magnetic resonance (hereinafter referred to as "NMR") according to an embodiment of the present invention. In FIG. 3, reference numeral 1 denotes a static field generation coil; 2 is a gradient field generation coil; 3 is a shim coil for adjusting the static magnetic field homogeneity; and 4 is an object of inspection. This object 4 is disposed inside the coils 1, 2 and 3. Reference numeral 5 denotes a sequencer, which sends an instruction to a shim power supply unit 6 and lets the coil 3 generate an additional magnetic field for correcting static magnetic field inhomogeneity. The coil 3 comprises a plurality of channels, and a current flowing through each coil is controlled by the sequencer 5 when homogeneity of the static magnetic field is adjusted.

This adjustment of static magnetic field homogeneity will be later described in further detail but when static magnetic field homogeneity is adjusted prior to the practical measurement of the object, a filter changeover switch 18 shown in FIG. 3 switches a low-pass filter of a shim power supply unit to a low-pass filter 19 having a small time constant so as to quickly carry out the adjustment without deteriorating a signal-to-noise ratio (S/N) at the time of practical measurement of the sample, and switches the low-pass filter of the shim power supply unit to a low-pass filter 20 having a large time constant at the practical measurement of the object.

The sequencer 5 also sends instructions to a gradient field driver 7 and to an RF transmitter 8 and provides a gradient magnetic field and an RF magnetic field. The RF magnetic field is applied from an RF transmitter 11 to the object 4 through an RF demodulator 9 and an RF amplifier 10. The signals generated from the object 4 are received by a receiver 12 and are sent to a CPU 16 through an amplifier 13, a phase detector 14 and an A/D converter 15, and the CPU 16 processes these signals. The signals and measurement conditions can be stored in a memory medium 17, whenever necessary.

FIG. 1 shows a measurement method according to an embodiment of the present invention. In FIG. 1, Gx, Gy and Gz will be hereinafter referred to as a readout magnetic gradient field, an encode gradient magnetic field and a slice gradient magnetic field, respectively.

In the measurement method according to this embodiment, 90° pulses are applied, first of all, with the slice gradient magnetic field Gz(1) to excite a specific slice plane $SL_1$. Next, the encode gradient magnetic field Gy(1) is applied to change the phase of a spin (phase encode) and at the same time, the gradient magnetic field Gx(1) is applied to disperse the phases (dephase). Thereafter, a 180° pulses (1) is applied with the slice gradient magnetic field Gz(2) and subsequently, the gradient magnetic field Gx(2) is applied to return the phases dephased by Gx(1) and to read out the spin echo (1) (rephase).

Assuming the interval between the center of the 90° pulse and that of the 180° pulse (1) is $\tau1$, then the echo center occurs ordinarily after the passage of the time $\tau1$ from the center of the 180° pulse (1) and influences of static magnetic field inhomogeneity, etc, cancel out. The echo center can be deviated deliberately by adjusting the application timing of the gradient magnetic field Gx(2). In this case, the echo center exists at the point of time at which the product of the gradient magnetic field intensity and application time of the gradient magnetic field Gx(1) is equal to that of the gradient magnetic field Gx(2). In this embodiment, the echo center is forwardly deviated by $\epsilon1$. Therefore, the spin echo (1) contains phase data that occur during the period of the time $\epsilon1$ due to static magnetic field inhomogeneity.

Raw data $F'_1(tx, Gy)$ of the spin echo (1) on the slice plane $SL_1$ described above are given by the following formula (2):

$$F_1'(tx, Gy) = \int \rho(x, y) \exp\left(-\frac{2\tau_1 - \epsilon_1}{T_2}\right) \quad (2)$$

$$\exp[i\gamma(Gx \cdot x \cdot tx - Gy \cdot y \cdot ty - Ec(x, y) \cdot \epsilon_1)]dxdy$$

where $\rho(x, y)$ is a spin density distribution of the object, $Ec(x, y)$ is the static magnetic field distribution of $SL_1$ including influences of the chemical shift, $T_2$ is a transverse relaxation time, tx is the time from the echo center at the time of signal readout and ty is the application time of the encode gradient magnetic field.

However, a damping term due to the transverse relaxation is represented by the damping term at the echo center, assuming that the former is constant for one spin echo.

Since the phase again disperses after passing by the echo center, Gx(2) is inversed to return the phase after the spin echo (1) is read out, and then the spin echo (2) is read out.

Raw data $F'_2(tx, Gy)$ of the spin echo (2) on $SL_1$ are given by the following equation (3):

$$F_2'(tx, Gy) = \int \rho(x, y) \exp\left(-\frac{2\tau_1 + \epsilon_2}{T_2}\right) \quad (3)$$

$$\exp[i\gamma(-Gx \cdot x \cdot tx - Gy \cdot y \cdot ty + Ec(x, y) \cdot \epsilon_2)]dxdy$$

When the time between the center of the 180° pulse (1) and the echo center of the spin echo (2) is $\tau_1 + \epsilon_2$, the spin echo (2) contains the phase data that occur during the time $\epsilon_2$ due to static magnetic field inhomogeneity.

Thereafter, the 180° pulse (2) is again applied with the slice gradient magnetic field Gz(3) and subsequently, the gradient magnetic field gx(3) is applied so that the spin echo (3) is read out.

The internal between the center of the 180° pulse (1) and that of the 180° pulse (2) is assumed to be $\tau_1 + \tau_2$. At this time, the echo center is forwardly deviated by $\epsilon_1$ in the same way as the spin echo (1).

Raw data $F'_3(tx, Gy)$ of the spin echo (3) on $SL_1$ are given by the following equation (4):

$$F_3'(tx, Gy) = \int \rho(x, y) \exp\left(-\frac{2(\tau_1 + \tau_2) - \epsilon_1}{T_2}\right) \quad (4)$$

$$\exp[i\gamma(Gx \cdot x \cdot tx + Gy \cdot y \cdot ty - Ec(x, y) \cdot \epsilon_1)]dxdy$$

New raw data $F_1(tx, Gy)$, $F_2(tx, Gy)$ and $F_3(tx, Gy)$ such as given by the equations (5) to (7) can be obtained by changing the sequence of arrangement of these raw data, respectively:

$$F_1(tx, Gy) = \int \rho(x, y) \exp\left(-\frac{2\tau_1 - \epsilon_1}{T_2}\right) \quad (5)$$

$$\exp[i\gamma(Gx \cdot x \cdot tx + Gy \cdot y \cdot ty - Ec(x, y) \cdot \epsilon_1)]dxdy$$

$$F_2(tx, Gy) = \int \rho(x, y) \exp\left(-\frac{2\tau_1 + \epsilon_2}{T_2}\right) \quad (6)$$

$$\exp[i\gamma(Gx \cdot x \cdot tx + Gy \cdot y \cdot ty + Ec(x, y) \cdot \epsilon_2)]dxdy$$

$$F_3(tx, Gy) = \int \rho(x, y) \exp\left(-\frac{2(\tau_1 + \tau_2) - \epsilon_1}{T_2}\right) \quad (7)$$

$$\exp[i\gamma(Gx \cdot x \cdot tx + Gy \cdot y \cdot ty - Ec(x, y) \cdot \epsilon_1)]dxdy$$

The image data that are obtained by Fourier transforming the raw data described above are represented by $S_1(x, y)$, $S_2(x, y)$ and $S_3(x, y)$ given by the equations (8) to (10), respectively:

$$S_1(x, y) = \rho(x, y) \exp\left(-\frac{2\tau_1 - \epsilon_1}{T_2}\right) \quad (8)$$

$$\exp[-i\gamma Ec(x, y)\epsilon_1]$$

$$S_2(x, y) = \rho(x, y) \exp\left(-\frac{2\tau_1 + \epsilon_2}{T_2}\right) \quad (9)$$

$$\exp[i\gamma Ec(x, y)\epsilon_2]$$

$$S_3(x, y) = \rho(x, y) \exp\left(-\frac{2(\tau_1 + \tau_2) - \epsilon_1}{T_2}\right) \quad (10)$$

$$\exp[-i\gamma Ec(x, y)\epsilon_1]$$

First, the method of determining the distribution of the transverse relaxation will be explained. In this embodiment, the term of static magnetic field inhomogeneity included in the image data $S_1(x, y)$ and $S_3(x, y)$ is equal. Therefore, when the ratio of $S_1(x, y)$ and $S_3(x, y)$ is calculated from the equations (8) and (10), the terms of spin density and static magnetic field inhomogeneity disappear and $T_2$ can be obtained as represented by equation (11):

$$T_2 = \frac{2\tau_2}{\ln(S_1/S_2)} \quad (11)$$

In the measurement method shown in FIG. 1, the phase data can be obtained from $S_1(x, y)$ and $S_2(x, y)$. From the equations (8) and (9), the ratio of $S_1(x, y)$ and $S_2(x, y)$ is given by the equation (12):

$$S_2/S_1 = \exp\left(-\frac{\epsilon_1 + \epsilon_2}{T_2}\right) \exp[i\gamma Ec(\epsilon_1 + \epsilon_2)] \quad (12)$$

If $\alpha$ is defined by the equation (13), the real and imaginary portions of $\alpha$ are given by the equations (14) and (15), respectively:

$$\alpha = \frac{1}{\exp\left(-\frac{\epsilon_1 + \epsilon_2}{T_2}\right)} \cdot \frac{S_2(x, y)}{S_1(x, y)} \quad (13)$$

$$Re(\alpha) = \cos\{\gamma Ec(x, y) \cdot (\epsilon_1 + \epsilon_2)\} \quad (14)$$
$$Img(\alpha) = \sin\{\gamma Ec(x, y) \cdot (\epsilon_1 + \epsilon_2)\} \quad (15)$$

Therefore, $Ec(x, y, z)$ can be determined from the equation (16):

$$Ec(x, y, z) = \frac{1}{\gamma(\epsilon_1 + \epsilon_2)} \cdot \text{Arctan}\left(\frac{Img(\alpha)}{Re(\alpha)}\right) \quad (16)$$

$$= \frac{1}{\gamma(\epsilon_1 + \epsilon_2)} \cdot \text{Arctan}\left(\frac{Img(S_2(x,y)/S_1(x,y))}{Re(S_2(x,y)/S_1(x,y))}\right)$$

Here, $Ec(x, y, z)$ represents the phase data occurring due to static magnetic field inhomogeneity and chemical shift in the unit of the magnetic field. Originally, it is only the data of static magnetic field inhomogeneity that should be determined. Therefore, the phase term due to the chemical shift must be removed from $Ec(x, y, z)$. Hereinafter, the removal of the phase term due to the chemical shift will be explained about the case where static magnetic field inhomogeneity of the human body is determined, by way of example.

To determine the static magnetic field distribution, it is customary to use proton signals having a by far higher S/N than other nucleides. The proton signals obtained from the human body are almost those of water and fats. It is therefore possible to easily anticipate at which position of the spatial region the fats exist on the basis of the $T_2$ data obtained from the equation (11). A phase difference due to the chemical shift of 3.4 ppm between water and fats exists in $Ec(x, y, z)$ between the existing position of water and that of the fats.

The removal of the phase term due to the chemical shift is achieved by substracting the phase difference resulting from the chemical shift from $Ec(x, y, z)$ at the existing position of the fats. This difference is given by 3.4 ppm$\times f_o/\gamma$ with $f_o$ representing a resonance frequency. In accordance with the procedures described above, the static magnetic field inhomogeneity distribution can be determined from the phase data contained in the signals of the object comprising a plurality of components having different chemical shifts.

In the embodiment described above, the time $\epsilon_1 + \epsilon_2$ between the echo centers of the spin echoes (1) and (2) is the time which is determined by the readout time of one echo and the rise time of the gradient magnetic field. When a sampling rate is 0.4 $\mu$sec, the number of sampling points is 256 and the rise time of the gradient field is 1 msec, for example, the time $\epsilon_1 + \epsilon_2$ is approximately 4.4 msec. By the way, if the deviation of the echo center becomes great, the phase rotation sometimes exceeds $2\pi$ due to the influences of static magnetic field inhomogeneity and a problem occurs when the phase distribution is determined. If $\epsilon_1$ is zero, for example, the influences of static magnetic field inhomogeneity contained in the spin echo (2) becomes great and the above-mentioned problem occurs in some cases. To cope with this problem, the present invention can reduce the influences of static magnetic field inhomogeneity contained in the spin echo (2) by setting $\epsilon_1$ to 1 msec, for example, so as to shorten $\epsilon_2$.

In the adjustment of static magnetic field homogeneity by the use of the static magnetic field distribution, which is obtained by detecting the signals of a plurality of slice planes by utilizing the waiting time of so-called "view" in accordance with each intensity of the encode gradient magnetic field, the measurement described above can simultaneously make the adjustment on a plurality of slice planes. When the measurement is carried out in practice, it has often been carried out to measure in advance the image or images of one or a plurality of slice planes within a short time, to decide the region of interest on the basis of the former and thereafter to effect the measurement for a long time. However, if the signal of adjustment of static magnetic field homogeneity is in advance measured for a plurality of slice planes as described above, the region of interest can be decided by the use of the signal obtained from these signals. At this time, the signals of any of the spin echoes (1), (2) and (3) may be used.

According to the embodiment described above, the spatial distribution of the transverse relaxation time is measured when the static magnetic field distribution is determined from the phase data of the signals obtained from the object so as to anticipate the component distribution of the object, and the difference of the phase terms due to the chemical shifts contained in the phase data is removed. Therefore, even when a heterogeneous object is used, the static magnetic field inhomogeneity distribution can be determined by the use of the phase distribution. Since the phase distribution and the distribution of the transverse relaxation can be obtained by a single measurement, the measurement of the static magnetic field inhomogeneity distribution using a heterogeneous object can be carried out rapidly. Though the explanation has so far been made about the heterogeneous object, the technical content of the embodiment described above may of course be applied as such to homogeneous objects, as well.

The embodiment given above merely illustrates an embodiment of the present invention. Needless to say, therefore, the present invention is not particularly limited to the embodiment given above.

Figure 4:
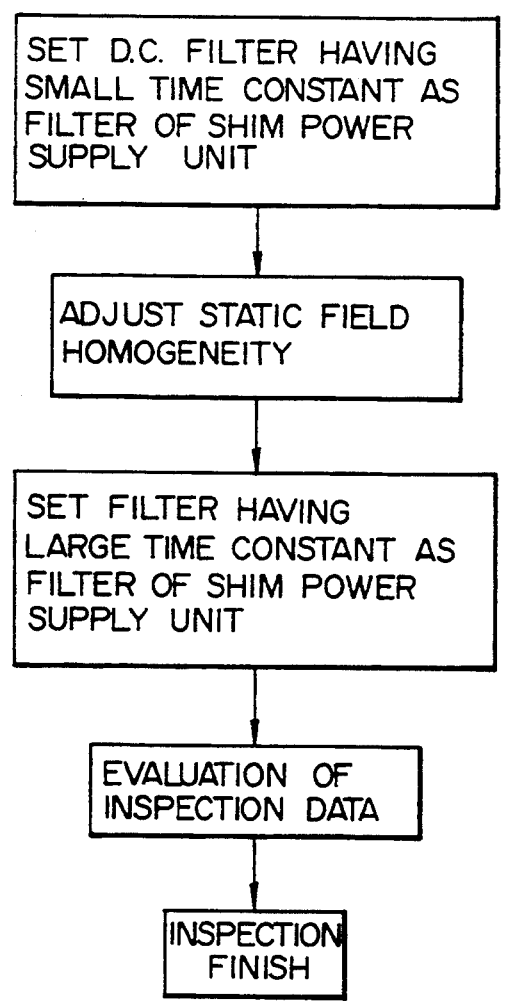
FIG. 4 is a flowchart of inspection using nuclear magnetic resonance according to the present invention.

Next, another embodiment of the present invention for rapidly adjusting the static magnetic field homogeneity will be explained with reference to FIGS. 3 to 4. FIG. 4 is a flowchart of the inspection by nuclear magnetic resonance according to the present invention. FIG. 3 is a structural view showing an example of an inspection apparatus using NMR according to the present invention. When the adjustment of static magnetic field homogeneity is carried out before the actual measurement, the low-pass filter of the shim power supply unit is changed by the filter changeover switch 18 shown in FIG. 3 to the low-pass filter 19 having a small time constant at the time of the adjustment of static magnetic field homogeneity, and to the low-pass filter 20 having a large time constant at the time of the actual measurement of the object. In FIG. 3, reference numeral 1 represents the static magnetic field generation coil; 2 is the gradient magnetic field generation coil; 3 is the shim coil for adjusting static magnetic field homogeneity; and 4 is the object. The object 4 is disposed inside these coils 1, 2 and 3. The sequencer 5 sends an instruction to the shim power supply unit 6 and lets the coil 3 generate an additional magnetic field for correcting static magnetic field inhomogeneity.

Here, switching of the filters will be explained with reference to FIG. 3. The coil 3 comprises a plurality of channels, and the current flowing through each coil is controlled by the sequencer 5 when static magnetic field homogeneity is adjusted. The sequencer 5 sends instructions to the gradient field driver 7 and to the RF transmitter 8, and applied the gradient magnetic field and the RF magnetic field. The RF magnetic field is applied by the RF transmitter 11 to the object 4 through the RF demodulator 9 and the RF amplifier 10. The signals generated from the object are received by the receiver 12 and are sent through the amplifier 13, the phase detector 14 and the A/D convertor 15 to the CPU, where signal processing is executed. The signals and measurement conditions can be stored in the memory medium 17, whenever necessary.

As an application example of the present invention, the explanation will be given on the case where the adjustment of static magnetic field homogeneity is effected by measuring the static magnetic field distribution. In this case, a uniform static magnetic field distribution can be obtained by superposing an additional field which will make the measured static magnetic field distribution uniform. It is the shim coil that is used for the purpose of generating this additional magnetic field. Since the shim coil comprises a plurality of channels having different characteristics, the value of a current flowing through each coil is delicately changed for each channel so that the change of the static magnetic field distribution can be measured and shim characteristics can be measured beforehand. Alternatively, the characteristics are in advance determined by theoretical calculation. If the shim characteristics are known, the set of current values necessary for making uniform the static magnetic field distribution can be obtained by least-squares, or the like. The uniform static magnetic field distribution can be obtained by adding the current value thus obtained to each shim coil. During the adjustment described above, the shim current value is often changed over such as when the shim characteristics are measured, and the measurement time can be reduced by using a low-pass filter having a small time constant (about 10 ms) among the low-pass filters of the shim power supply unit. Though the noise contained in the signal becomes great at this time, there is no problem because the measurement is for the adjustment.

As another application example of the present invention, the explanation will be given about the case where static magnetic field homogeneity is adjusted in accordance with the algorithm shown in FIG. 5. Secondary interpolation, etc, is used as the algorithm for finding out the optimum shim current value. The peak value of the NMR spectrum and the sum of absolute values of free induction decay, for example, are employed as evaluation functions that are used at the evaluation step of static magnetic field homogeneity. Either of them increases with the improvement in static magnetic field homogeneity. Since static magnetic field homogeneity is disturbed by a permeability distribution of the object, etc, the final adjustment is preferably made by the use of the object itself immediately before the inspection. Accordingly, the adjustment must be carried out as quickly as possible in order to reduce the inspection time.

Figure 5:
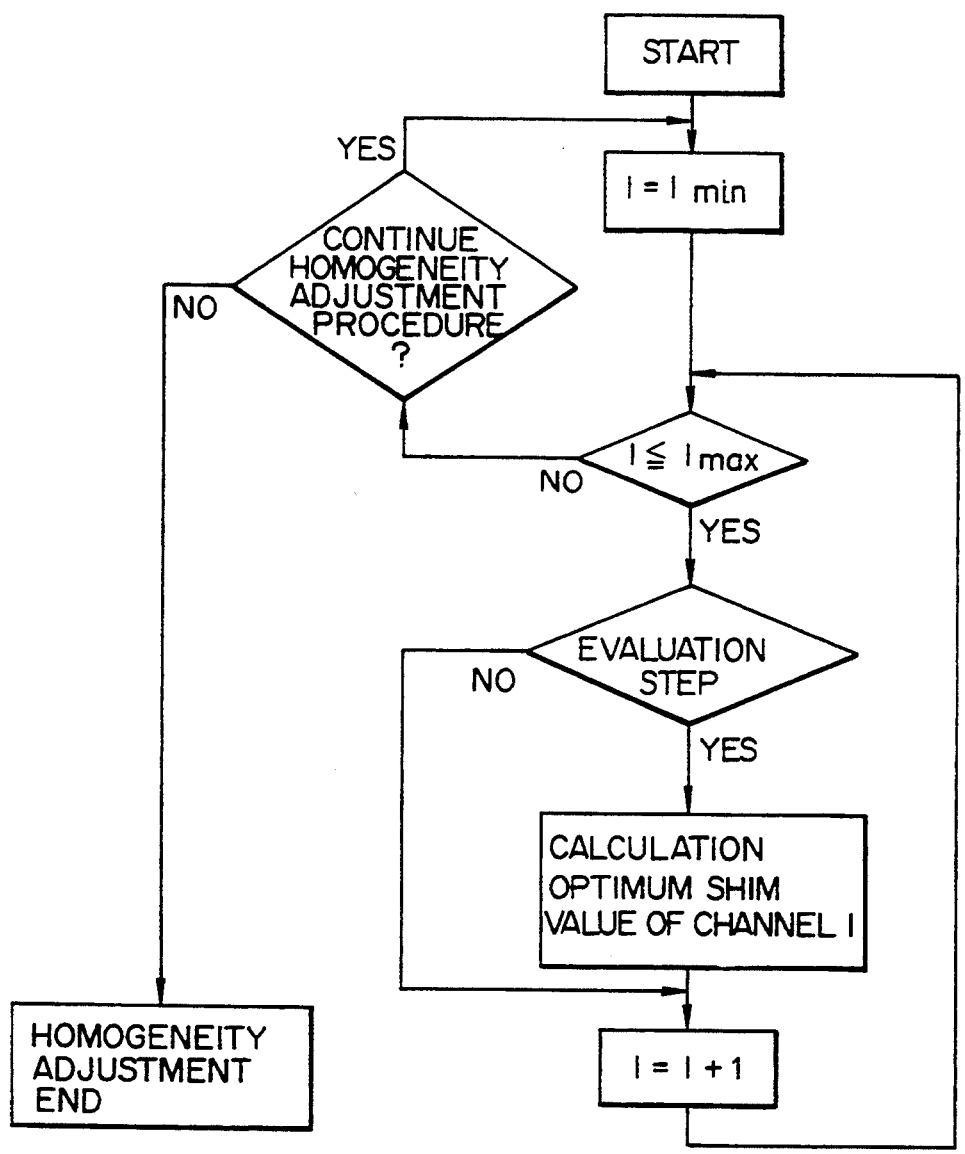
FIG. 5 is a flowchart showing an algorithm for adjusting static magnetic field inhomogeneity for practicing the present invention.

In the algorithm shown in FIG. 5, evaluation of the signals measured by the measurement system described above is repeated while changing the shim current value with a suitable step for each channel I of the coil 3, and an optimum shim current value is searched for each of the channels Imin to Imax. Then, this procedure proceeds to the next channel. During such evaluation, the shim current value must be changed very often. To quickly make the adjustment, therefore, the current value must be quickly switched. This switching time of the current value is determined by the response of the low-pass filter of the shim power supply unit; hence, the low-pass filter 19 having a small time constant (about 10 ms) is used during the adjustment of static magnetic field homogeneity. Though the noise contained in the signal becomes great at this time, there occurs no practical problem so long as static magnetic field homogeneity can be evaluated by the use of the evaluation function described above.

The practical measurement is carried out after the adjustment of static magnetic field homogeneity is completed. Since the shim current value need not be changed at this time, the low-pass filter of the shim power supply unit is changed over to the low-pass filter 20 having a large time constant (about 1 s) by the filter changeover switch 18, and signals having small noise can be obtained. Filters having different time constants may be prepared separately, or the time constant can be changed by changing the value of an internal capacitor.

We claim:

1. An inspection method for inspecting an object by the use of nuclear magnetic resonance (NMR) by generating a static magnetic field, gradient magnetic fields and RF magnetic fields, detecting nuclear magnetic resonance signals from said object and processing said detection signals, comprising:
    (a) a first step including a first sub-step of obtaining first and second data sets of nuclear magnetic resonance signals which contain different information of a phase distribution of nuclear magnetic resonance signals from said object, a second sub-step of reconstructing a first and second complex multipixel image from said first and second data sets, and a third sub-step of dividing each pixel of the first complex multipixel image by the corresponding pixel of the second complex multipixel image so as to obtain an apparent inhomogeneity distribution of said static magnetic field;
    (b) a second step of obtaining a distribution of transverse relaxation times of said object;
    (c) a third step of obtaining a distribution of each of a plurality of materials contained in said object from the distribution of said transverse relaxation times obtained at the second step of (b); and
    (d) a fourth step of removing a phase term due to a chemical shift from the apparent inhomogeneity distribution of said static magnetic field obtained at the step of (a);
    wherein the first and second steps are executed in a single nuclear magnetic resonance scan while applying a single RF magnetic field for exciting spins and applying a plurality of gradient magnetic fields for rephasing spins.

2. An inspection method for inspecting an object by the use of nuclear magnetic resonance (NMR) according to claim 1, wherein the sub-step of measuring the phase distribution in the first step and the second step for measuring the distribution of the transverse relaxation times of the object are both executed by use of the detected NMR signals according to a plurality of echoes generated in response to respective rephasings by the gradient magnetic fields.

3. An inspection method for inspecting an object by the use of nuclear magnetic resonance (NMR) according to claim 1, wherein the sub-step of measuring the phase distribution in the first step is executed by use of a first signal according to a first echo which is generated in response to a first rephasing by a gradient magnetic field and a second signal according to a second echo which is generated in response to a second rephasing by a gradient magnetic field, and the second step for measuring the distribution of the transverse relaxation times of the object is executed by use of the first signal and a third signal according to a third echo which is generated in response to a third rephasing by a gradient magnetic field.

4. An inspection method for inspecting an object by the use of nuclear magnetic resonance (NMR) by generating a static magnetic field, gradient magnetic fields and RF magnetic fields, generating an additional field for making said static magnetic field more homogeneous by changing intensities of electric currents flowing through a plurality of shim coils, and inspecting said object after homogeneity of said static magnetic field is adjusted to be more homogeneous, comprising: a step of selecting a low-pass filter from one of a first low-pass filter and a second low-pass filter having different time constants from each other, the time constant of the first low-pass filter being smaller than the time constant of the second low-pass filter, and said first and second low-pass filters being arranged between a shim power supply unit and said plurality of shim coils for generating said additional field.

5. An inspection method for inspecting an object by the use of nuclear magnetic resonance (NMR) according to claim 4, wherein the first low-pass filter is selected when homogeneity of said static magnetic field is adjusted to be more homogeneous.

6. An inspection method for inspecting an object by the use of nuclear magnetic resonance (NMR) according to claim 5, wherein the second low-pass filter is selected when said object is inspected after the adjustment of said static magnetic field to be more homogeneous.

7. An inspection method for inspecting an object by the use of nuclear magnetic resonance (NMR) by generating a static magnetic field, gradient magnetic fields and RF magnetic fields, generating an additional field by changing intensities of electric currents flowing through a plurality of shim coils, detecting nuclear magnetic resonance signals from said object, processing said nuclear magnetic resonance signals so as to make said static magnetic field more homogeneous, and then inspecting said object, comprising:
a step of selecting a low-pass filter from one of a first low-pass filter and second low-pass filter having different time constants from each other, the time constant of the first low-pass filter being smaller than the time constant of the second low-pass filter, and said first and second low-pass filter being arranged between a shim power supply unit and said plurality of shim coils for generating said additional field, said first low-pass filter being selected when homogeneity of said static magnetic field is adjusted to be more homogeneous and said second low-pass filter being selected when said object is inspected after the adjustment of said static magnetic field to be more homogeneous.

8. An inspection apparatus using nuclear magnetic resonance (NMR), comprising:
generation means for generating a static magnetic field, gradient magnetic fields and RF magnetic fields, respectively;
generation means for generating additional magnetic fields for making said static magnetic field more homogeneous by changing intensities of electric currents flowing through a plurality of shim coils;
signal detection means for detecting nuclear magnetic resonance signals from said object;
a processor for processing detection signals of said signal detection means;
shim power supply means for generating said additional magnetic field, equipped with a first and second low-pass filter having different time constants from each other, the time constant of the first low-pass filter being smaller than the time constant of the second low-pass filter, and said first and second low-pass filter being arranged between a shim power supply unit and said plurality of shim coils for generating said additional field; and
change-over means for selecting a low-pass filter from one of the first and second low-pass filters.

9. An inspection apparatus using nuclear magnetic resonance (NMR) according to claim 8, wherein said change-over means selects said first low-pass filter when said static magnetic field is adjusted so as to be more homogeneous on the basis of said detection signals.

10. An inspection apparatus using nuclear magnetic resonance (NMR) according to claim 9, wherein said change-over means selects said second low-pass filter when inspection of said object is carried out after homogeneity of said static magnetic field is adjusted so as to be more homogeneous on the basis of said detection signals.

11. An inspection apparatus using nuclear magnetic resonance (NMR), comprising:
generation means for generating a static magnetic field, gradient magnetic fields and RF magnetic fields, respectively;
generation means for generating additional magnetic fields for making said static magnetic field more homogeneous by changing intensities of electric currents flowing through a plurality of shim coils;
signal detection means for detecting nuclear magnetic resonance signals from said object;
a processor for processing detection signals of said signal detection means;
shim power supply means for generating said additional magnetic field, equipped with a first and second low-pass filter having different time constants from each other, the time constant of the first low-pass filter being smaller than the time constant of the second low-pass filter, and said first and second low-pass filter being arranged between a shim power supply unit and said plurality of shim coils for generating said additional field;
means for changing and generating said additional magnetic fields for making said static magnetic field more homogeneous on the basis of said detection signals; and
change-over means for selecting a low-pass filter from one of the first and second low-pass filters;
wherein said change-over means selects said first low-pass filter when additional magnetic fields are changed and generated for adjusting said static magnetic field so as to be more homogeneous on the basis of said detection signals, and said change-over means selects said second low-pass filter when inspection of said object is effected after the adjustment of homogeneity of said static magnetic field.

12. An inspection method for inspecting an object by the use of nuclear magnetic resonance (NMR) by generating a static magnetic field, gradient magnetic fields and RF magnetic fields, detecting nuclear magnetic resonance signals from said object and processing said detection signals, comprising:
(a) a first step including a first sub-step of obtaining a first and second data set of nuclear magnetic resonance signals which contain different information of a phase distribution of nuclear magnetic resonance signals from said object, a second sub-step of reconstructing a first and second complex multipixel image from said first and second data sets, and a third sub-step of dividing each pixel of the first complex multipixel image by the corresponding pixel of the second complex multipixel image so as to obtain an apparent inhomogeneity distribution of said static magnetic field;

(b) a second step of obtaining a distribution of transverse relaxation times of said object;

(c) a third step of obtaining a distribution of each of a plurality of materials contained in said object from the distribution of said transverse relaxation times obtained at the second step of (b);

(d) a fourth step of removing a phase term due to a chemical shift from the apparent inhomogeneity distribution of said static magnetic field obtained at the step of (a):

(e) a step of making said static magnetic field more homogeneous by using the inhomogeneity distribution of said static magnetic field obtained at the step of (d); and (f) a step of selecting a low-pass filter from one of a first low-pass filter and a second low-pass filter having different time constants from each other, the time constant of the first low-pass filter being smaller than the time constant of the second low-pass filter, and said first and second low-pass filters being arranged between a shim power supply unit and said plurality of shim coils for generating said additional field, said first low-pass filter being selected when homogeneity of said static magnetic field is adjusted to be more homogeneous.

13. An inspection method for inspecting an object by the use of nuclear magnetic resonance (NMR) by generating a static magnetic field, gradient magnetic fields and RF magnetic fields, detecting nuclear magnetic resonance signals from said object and processing said detection signals, comprising:

(a) a first step including a first sub-step of obtaining first and second data sets of nuclear magnetic resonance signals which contain different information of a phase distribution of nuclear magnetic resonance signals from said object, a second sub-step of reconstructing a first and second complex multipixel image from said first and second data sets, and a third sub-step of dividing each pixel of the first complex multipixel image by the corresponding pixel of the second complex multipixel image so as to obtain an apparent inhomogeneity distribution of said static magnetic field;

(b) a second step of obtaining a distribution of transverse relaxation times of said object;

(c) a third step of obtaining a distribution of each of a plurality of materials contained in said object from the distribution of said transverse relaxation times obtained at the second step of (b);

(d) a fourth step of removing a phase term due to a chemical shift from the apparent inhomogeneity distribution of said static magnetic field obtained at the step of (a);

(e) a step of making said static magnetic field more homogeneous by using the inhomogeneity distribution of said static magnetic field obtained at the step of (d); and (f) a step of selecting a low-pass filter from one of a first low-pass filter and a second low-pass filter having different time constants from each other, the time constant of the first low-pass filter being smaller than the time constant of the second low-pass filter, and said first and second low-pass filters being arranged between a shim power supply unit and said plurality of shim coils for generating said additional field, said second low-pass filter being selected when said object is inspected after the adjustment of said static magnetic field to be more homogeneous.

14. An inspection method for inspecting an object by the use of nuclear magnetic resonance (NMR) by generating a static magnetic field, gradient magnetic fields and RF magnetic fields, detecting nuclear magnetic resonance signals from said object and processing said detection signals, comprising:

(a) a first step including a first sub-step of obtaining first and second data sets of nuclear magnetic resonance signals which contain different information of a phase distribution of nuclear magnetic resonance signals from said object, a second sub-step of reconstructing a first and second complex multipixel image from said first and second data sets, and a third sub-step of dividing each pixel of the first complex multipixel image by the corresponding pixel of the second complex multipixel image so as to obtain an apparent inhomogeneity distribution of said static magnetic field, the first sub-step of obtaining the first data set including a sub-step of applying a 90° pulse to said object with a slice gradient magnetic field so as to excite spins of a specific slice plane of said object selectivity, a sub-step of changing the phase of said spins by applying an encode magnetic gradient field, a sub-step of applying subsequently a 180° pulse, and a sub-step of detecting a first signal while applying a readout gradient magnetic field, the first sub-step of obtaining the second data set including a sub-step of detecting a second signal by inverting said readout gradient magnetic field, and the second sub-step of reconstructing the first and second complex multipixel image including a sub-step of subjecting the first and second signal to Fourier transform processing respectively;

(b) a second step of obtaining a distribution of transverse relaxation times of said object, said second step including a sub-step of again applying a 180° pulse selectively acting on spins of said specific plane with a slice gradient magnetic field after the passage of a predetermined time, a sub-step of detecting third signal while a readout gradient magnetic field is being applied and a sub-step of reconstructing the third complex multipixel image including a sub-step of subjecting the third signal to Fourier transform processing, and said distribution of transverse relaxation times being obtained by dividing each pixel of the first complex multipixel image by the corresponding pixel of the third complex multipixel image;

(c) a third step of obtaining a distribution of each of a plurality of materials contained in said object from the distribution of said transverse relaxation times obtained at the second step of (b); and (d) a fourth step of removing a phase term due to a chemical shift from the apparent inhomogeneity distribution of said static magnetic field obtained at the step of (a);

wherein the first step and the second step are executed in a single nuclear magnetic resonance scan with application of said 90° pulse.

* * * * *